United States Patent
Dede

(10) Patent No.: US 8,516,831 B2
(45) Date of Patent: Aug. 27, 2013

(54) THERMAL ENERGY STEERING DEVICE

(75) Inventor: Ercan Mehmet Dede, Ann Arbor, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 369 days.

(21) Appl. No.: 12/828,754

(22) Filed: Jul. 1, 2010

(65) Prior Publication Data

US 2012/0000639 A1 Jan. 5, 2012

(51) Int. Cl.
*F25B 21/02* (2006.01)

(52) U.S. Cl.
USPC .................................. 62/3.2; 62/3.7

(58) Field of Classification Search
USPC ...... 62/56, 3.2, 3.7; 165/185, 200; 29/592.1, 29/890.03; 361/704, 709, 713
See application file for complete search history.

(56) References Cited

U.S. PATENT DOCUMENTS

| | | | |
|---|---|---|---|
| 6,207,886 B1 * | 3/2001 | Kusakabe et al. | 136/201 |
| 6,495,069 B1 | 12/2002 | Lussey et al. | |
| 6,503,964 B2 | 1/2003 | Smith et al. | |
| 6,919,631 B1 | 7/2005 | Hoffman et al. | |
| 7,263,766 B2 | 9/2007 | Ishiwata et al. | |
| 7,291,381 B2 | 11/2007 | Tobita et al. | |
| 7,480,145 B2 | 1/2009 | Ali | |
| 7,531,912 B2 * | 5/2009 | Tamura et al. | 290/51 |
| 7,608,315 B2 | 10/2009 | Uchida et al. | |
| 2005/0255304 A1 | 11/2005 | Brink | |
| 2006/0022589 A1 * | 2/2006 | Cok | 313/506 |
| 2007/0295496 A1 * | 12/2007 | Hall et al. | 165/185 |
| 2008/0083450 A1 | 4/2008 | Benoit et al. | |
| 2009/0017260 A1 | 1/2009 | Kulkarni et al. | |
| 2009/0085454 A1 | 4/2009 | Li et al. | |
| 2009/0174050 A1 | 7/2009 | Bernstein et al. | |
| 2009/0229649 A1 * | 9/2009 | Yang et al. | 136/201 |

* cited by examiner

*Primary Examiner* — Mohammad M Ali
(74) *Attorney, Agent, or Firm* — Gifford, Krass, Sprinkle, Anderson & Citkowski, P.C.

(57) ABSTRACT

A thermal flux steering device and method for steering thermal flux into a concentrated area is provided. The thermal flux steering device includes a matrix impregnated with a plurality of thermally conductive inclusions. The thermally conductive inclusions are angled so as to steer thermal flux into a concentrated area such as a thermal energy sink in communication with the matrix. The thermally conductive inclusions may be filler fibers or thermally conductive particles impregnated within the matrix. Orientation of the thermally conductive inclusions may be determined by detecting the thermal flux of the thermal energy source, the thermodynamic properties of the matrix and the thermally conductive inclusions, and the location of the flux concentration area.

23 Claims, 10 Drawing Sheets

Angle of Inclusion

72° - 117°

28° - 71°, 118° -152°

0° - 27°, 153° -180°

THERMAL ENERGY STEERING DEVICE

FIELD OF THE INVENTION

The present invention relates to a device for steering thermal flux. More particularly the invention relates to a device such as a composite material, having a matrix impregnated with a plurality of thermally conductive inclusions. The thermally conductive inclusions are angled so as to steer thermal flux to a predetermined location within the device.

BACKGROUND OF THE INVENTION

Many devices are subject to thermal flux, such as electronics, motors, internal combustion engines, and the like. The thermal flux is often dissipated into the environment. In some instances the thermal flux may be adverse and cause nearby components to malfunction. Accordingly, ancillary devices such as a fan are often used to cool the source and the nearby components. In other instances, a thermal energy sink (e.g. a thermoelectric device) is used to store the thermal energy for later use. However, thermal energy is often lost by dissipation into the environment prior to storage into the thermal energy sink. Accordingly, it remains desirable to have a device for reducing thermal energy loss or harvesting thermal energy by steering thermal flux to a predetermined location that is coupled to a thermal energy sink. The thermal energy stored in the thermal energy sink may be transformed into electrical energy.

SUMMARY OF THE INVENTION

According to one aspect of the invention, a thermal flux steering device such as a composite material, for steering thermal flux into a concentrated area is provided. The thermal flux steering device includes a matrix impregnated with a plurality of thermally conductive inclusions. The thermally conductive inclusions are angled so as to steer thermal flux into a concentrated area such as a thermal energy sink in communication with the matrix. The thermally conductive inclusions may be filler fibers or particles impregnated within the matrix. Orientation of the thermally conductive inclusions may be determined by detecting the thermal flux of the thermal energy source, the thermodynamic properties of the matrix and the thermally conductive inclusions, and the location of the thermal concentration area.

According to another embodiment of the invention, a thermal flux harvesting system operable to harvest thermal flux to actuate an ancillary device is provided. The thermal flux harvesting system includes a thermal energy source applied to a composite material having a thermoelectric device operatively attached to the ancillary device. The matrix of the composite material is impregnated with a plurality of thermally conductive inclusions. The thermally conductive inclusions are angled so as to steer thermal flux from the thermal energy source to the thermoelectric device so as to actuate the ancillary device.

According to another embodiment of the invention, a method for optimizing the orientation of a plurality of thermally conductive inclusions so as to steer thermal flux from a thermal energy source to a desired location is provided. The method includes the step of identifying the location of the thermal energy source and establishing a desired location for concentrating thermal flux. The thermally conductive inclusions are oriented within the matrix so as to minimize thermal resistance between the thermal source and the desired location.

BRIEF DESCRIPTION OF THE DRAWINGS

Advantages of the present invention will be readily appreciated as the same becomes better understood by reference to the following detailed description when considered in connection with the accompanying drawings wherein.

DETAILED DESCRIPTION OF THE INVENTION

Figure 1:
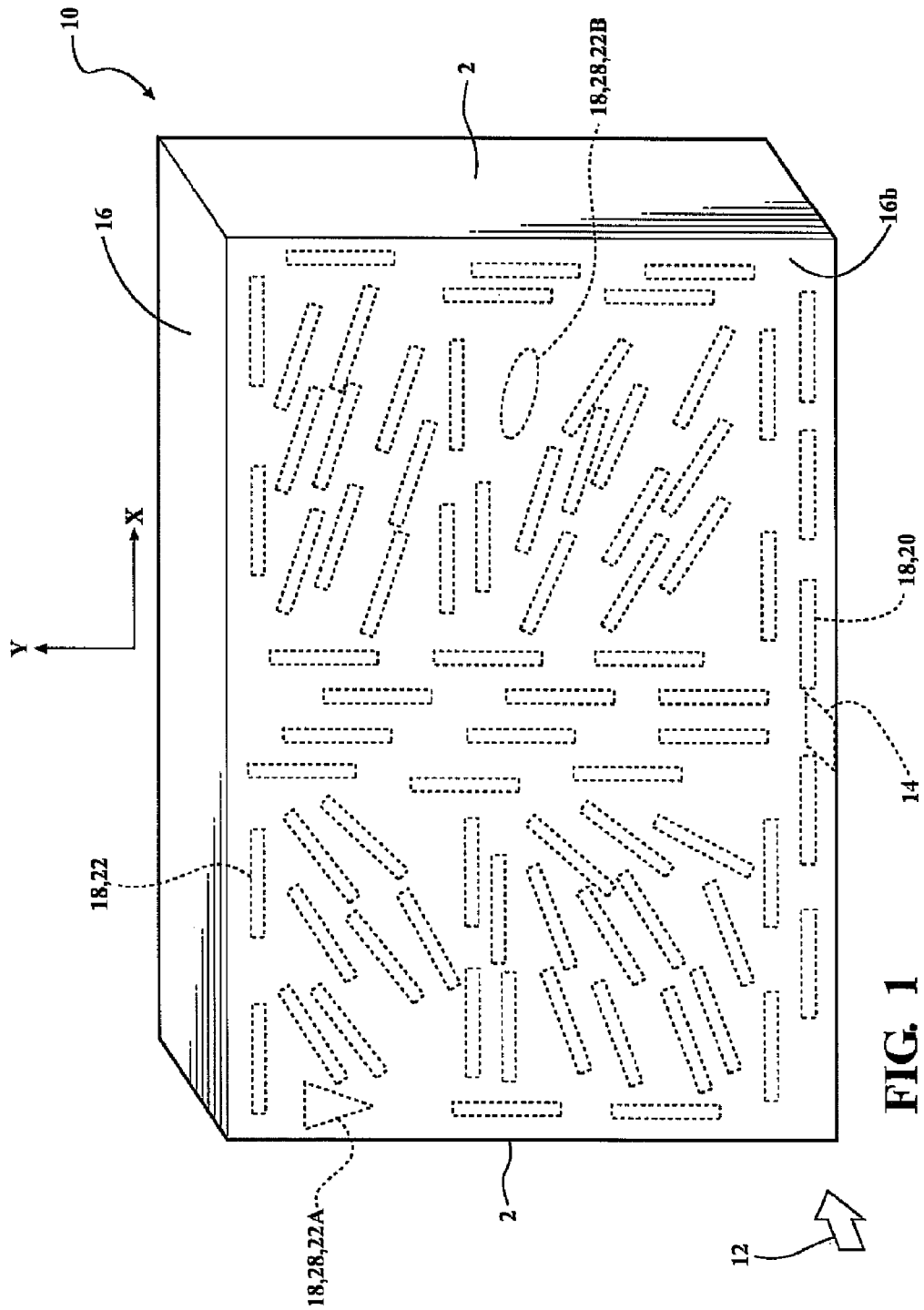
FIG. 1 is a perspective view of a representative thermal flux steering device, or composite material, of the present invention showing a matrix having a thermal energy sink and impregnated with a plurality of thermally conductive inclusions.

Referring to the Figures, a thermal flux steering device, also referenced by those in the art as a composite material, 10 for steering thermal flux to a predetermined location is provided. The thermal flux steering device 10 is operable to receive thermal flux from a thermal energy source 12 and steer the thermal energy to a desired location such as a thermal energy sink 14 for later harvesting. The thermal flux steering device 10 includes a matrix 16 impregnated with a plurality of thermally conductive inclusions 18. The thermally conductive inclusions 18 are oriented within the matrix 16 so as to steer or concentrate the thermal flux into a predetermined location.

With reference now to FIG. 1, a perspective view of the matrix 16 is provided. The matrix 16 is formed of material operable to hold and position the thermally conductive inclusions 18 at a predetermined angle. Such a material is currently known and used in the art and illustratively includes cyanate-ester resins, ceramics, or polymers. Preferably the matrix 16 is in communication with a thermal energy sink 14. The thermal energy sink 14 may be disposed in any location within the matrix 16, or along the outer surface of the matrix 16. The thermally conductive inclusions 18 are aligned so as to minimize thermal resistance between the thermal energy source 12 and the thermal energy sink 14. Preferably, the thermal energy sink 14 is a thermoelectric device operable to transform thermal flux into electricity. Though FIG. 1, shows the matrix 16 having a generally planar surface 16*b*, it is anticipated that the surface 16*b* of the matrix may not necessarily be uniform, that is the surface 16*b* of the matrix 16 may be undulated or bowed. Furthermore, the matrix 16 is shown formed generally of one layer, however, it should also be appreciated that the matrix may include a plurality of layers, each selectively impregnated with thermally conductive inclusions 18.

The thermally conductive inclusions 18 may be filler fibers 20 or particles 22 such as chopped carbon fibers 24 or metal particles 26. The filler fibers 20 and particles 22 are generally elongated and may have a length ranging anywhere from the microscale to nanoscale and similarly a diameter ranging anywhere from the microscale to the nanoscale. As used herein, "nanoscale" refers to dimensions such as length or diameter smaller than 100 nanometers. The term "microscale" refers to features and components with dimensions equal to, or greater than, 1 microns. Other thermally conductive inclusions 18 include an asymmetrically designed thermally conductive particle 28 within the matrix 16. For instance, the matrix 16 may be impregnated with a plurality of triangular 22*a* or ellipsoidal shaped 22*b* particles oriented to maximize the concentration of thermal flux. The asymmetrically shaped particles may enclose a volume ranging anywhere from the microscale to the nanoscale in size.

Figure 4:
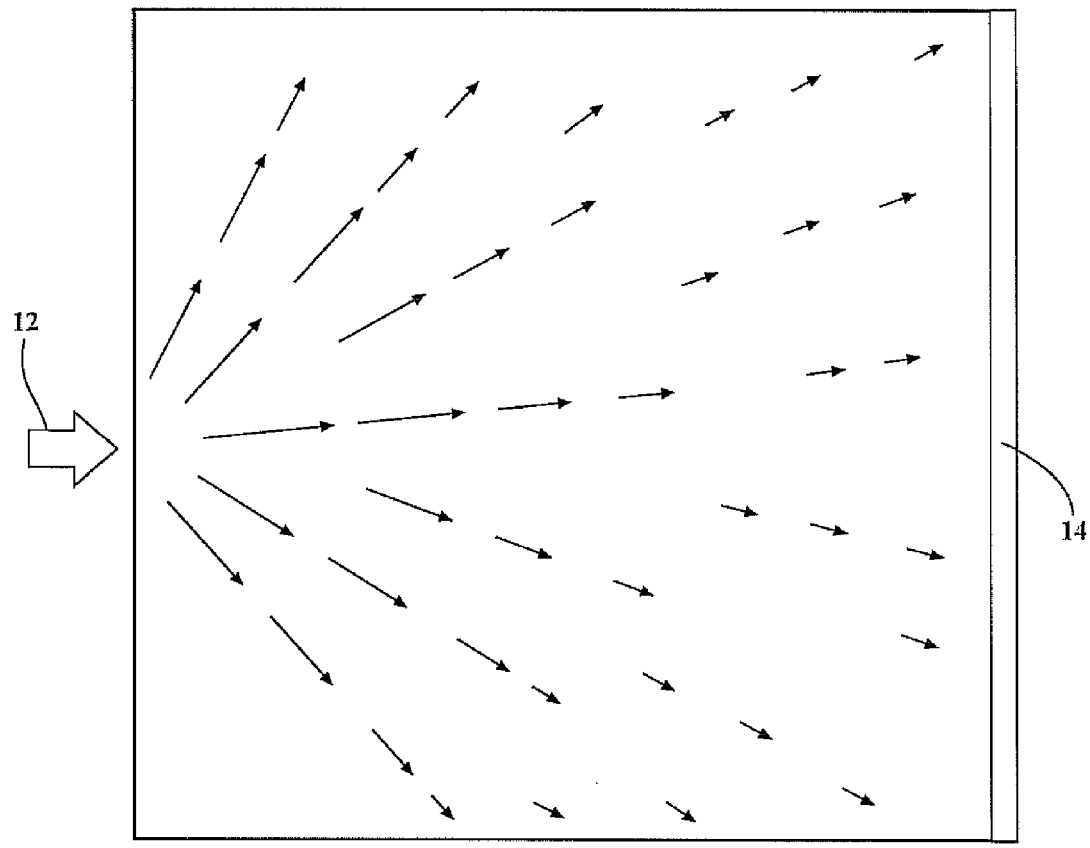
FIG. 4 is a cross-sectional view of a conventional isotropic matrix material showing the natural movement of thermal energy radiating through the body of the material.

With reference now to FIG. 4, an illustration of the natural movement of thermal energy through the body of an isotropic matrix 16 is provided. As shown, thermal energy generally radiates from the source, and decreases in intensity the further it travels from the source. The decrease in intensity may be attributable to thermal resistance and dissipation to a sink 14. The present invention utilizes thermally conductive inclusions 18 to steer the thermal energy to a predetermined location so as to minimize thermal resistance.

With reference now specifically to FIGS. 1, 2A, 2B, and 2C the operation of the thermal flux steering device 10 is provided. With reference again to FIG. 1, a perspective view of an embodiment of a matrix 16 of the present invention is provided. The matrix 16 is impregnated with a plurality of thermally conductive inclusions 18. The matrix may be impregnated with one type of thermally conductive inclusion 18, or may be impregnated with a combination of different types of thermally conductive inclusions 18, such as filler fibers 20, particles 22, or asymmetric thermally conductive particles 28. A portion of the surface of the matrix 16 is in communication with a thermal energy source 12. A thermal energy sink 14, also referenced in the art as a "heat sink," is disposed on another portion of the surface of the matrix 16.

Figure 2A:
FIG. 2A is a cross-section of the composite material and includes a legend showing different angles of orientation with respect to a shaded region of the material.
Figure 2A:
Figure 2A:
Figure 2A:
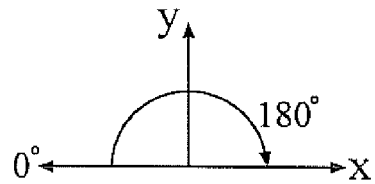
Figure 2A:
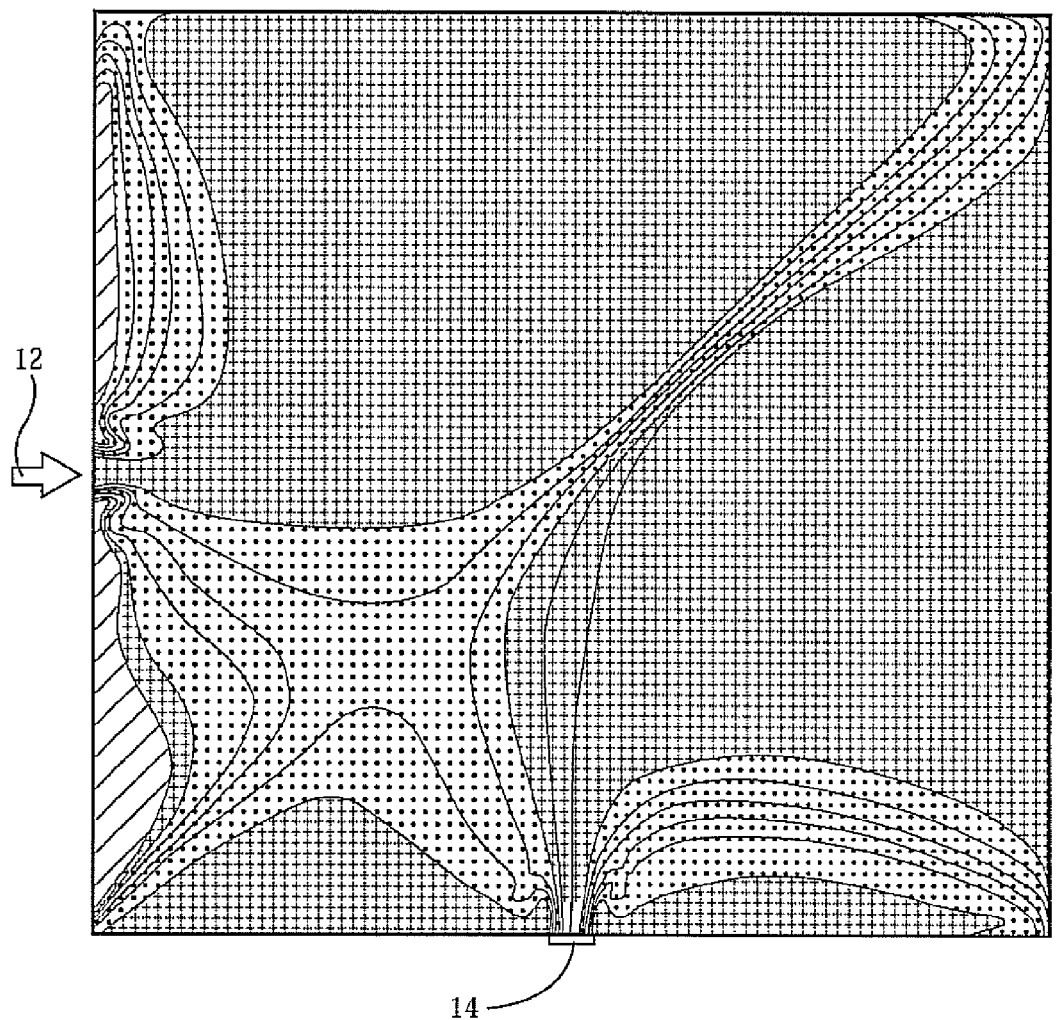

With reference now to FIG. 2A a cross-section of the matrix 16 shown in FIG. 1 is taken along lines 2-2 and the plane defined by axis labeled "X" and "Y." FIG. 2A includes a legend showing the different angles of orientation of the inclusions 18 with respect to a shaded region of the matrix 16. For illustrative purposes, the matrix 16 is impregnated with chopped carbon fibers 24. The chopped carbon fibers 24 have a predetermined length, and are oriented within the matrix 16 so as to steer thermal energy towards the heat sink. Specifically, the chopped carbon fibers 24 are oriented between an angle of zero and one hundred and eighty degrees with respect to the X and Y axis shown.

Figure 2B:
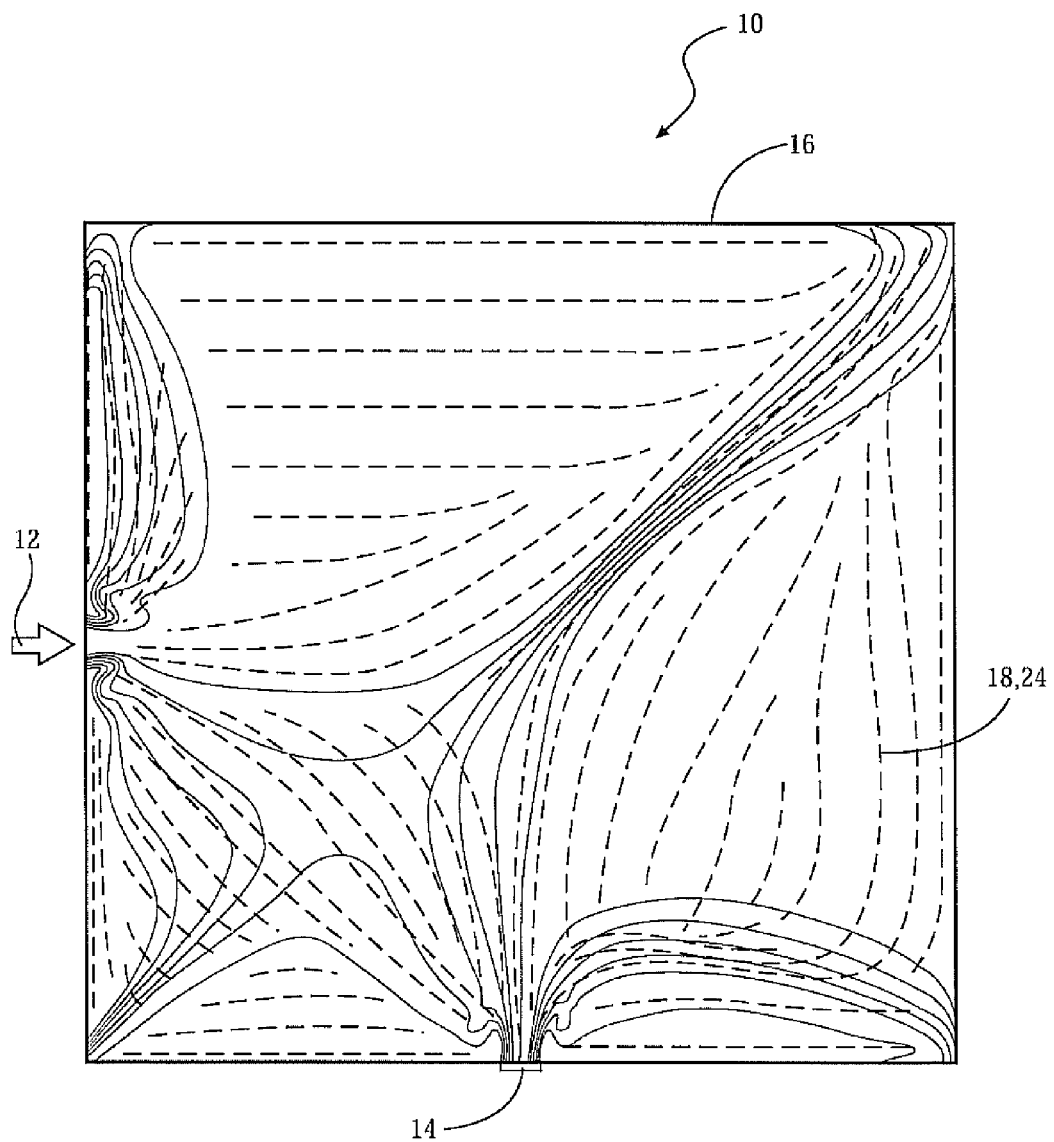
FIG. 2B is a perspective view of FIG. 2A showing the general orientation of the thermally conductive inclusions.
Figure 2C:
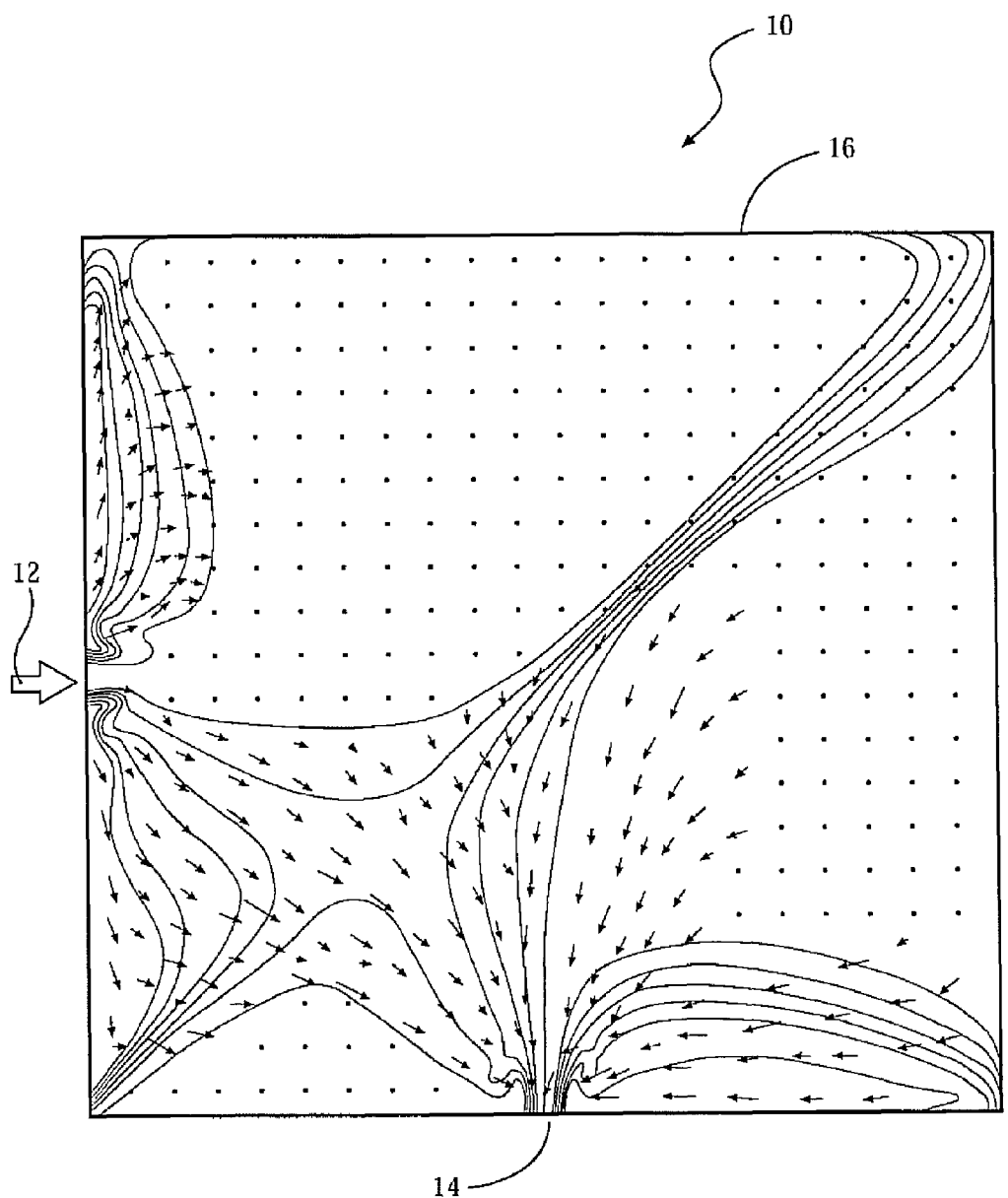
FIG. 2C is a perspective view of FIG. 2A showing the distribution and movement of thermal energy throughout the material.

With reference now to FIG. 2B, the orientation of individual chopped carbon fibers 24 are shown. With reference now to FIG. 2C, the path of thermal energy naturally radiating from the source and through the body of the matrix 16 is shown. As indicated by the large arrow, the thermal energy source 12 is coming from a side edge of the matrix 16. In an isotropic matrix 16 without inclusions, the thermal energy generally radiates throughout the body of the matrix 16 as shown in FIG. 4. The addition of thermally conductive inclusions 18 to form a composite material steers the movement of thermal energy through the matrix 16.

The thermally conductive inclusions 18 are distributed throughout the matrix 16 and are oriented so as to steer the thermal energy flux towards the thermal energy sink 14. Though the Figures show that the thermally conductive inclusions 18 are distributed generally uniformly throughout the body, it is understood by those skilled in the art that certain areas of the body may contain a higher concentration of thermally conductive inclusions 18 than others. The thermal conductive inclusions 18 are angled and concentrated so as to minimize thermal resistance between the thermal energy source 12 and the sink.

With reference again to FIGS. 2B and 2C, a description of the movement of thermal energy through the body of the matrix 16 is provided. The thermally conductive inclusions 18 are aligned generally vertically (90 degrees) along the upper left edge of the matrix 16 so as to reduce thermal resistance. The alignment of the thermally conductive inclusions 18 then transitions to a horizontal position so as to steer thermal energy towards the upper middle portion of the matrix 16, as shown in FIG. 2C. Thus, thermal resistance of the movement of thermal energy across the upper half of the matrix 16 is also reduced. As the thermal energy is steered towards the right-hand side of the matrix 16, the fillers are aligned at approximately a 45 or 135 degree angle so as to steer the thermal energy towards the thermal energy sink 14 disposed at the bottom of the matrix 16.

With reference now to the lower left one-quarter of the matrix 16, the filler fibers 20 are aligned along a generally 45 degree angle, along the angle of radiation, so as to facilitate the movement of thermal energy from the source to the thermal energy sink 14. Thus, thermal resistance is minimized as the fillers are aligned along generally the same direction in which the thermal energy flux is naturally traveling. The filler fibers 20 in the lower right one-quarter of the matrix 16 are generally disposed at an angle of 135 degrees so as to steer thermal energy back towards the thermal energy sink 14. It is appreciated by those skilled in the art that the alignment of the thermally conductive inclusions 18 is not only optimal for reducing thermal resistance, but for steering thermal energy to the heat sink with minimal thermal loss. Accordingly, the density of thermally conductive inclusions within the body may vary so as to reduce loss through dissipation and thermal resistance.

Figure 3A:
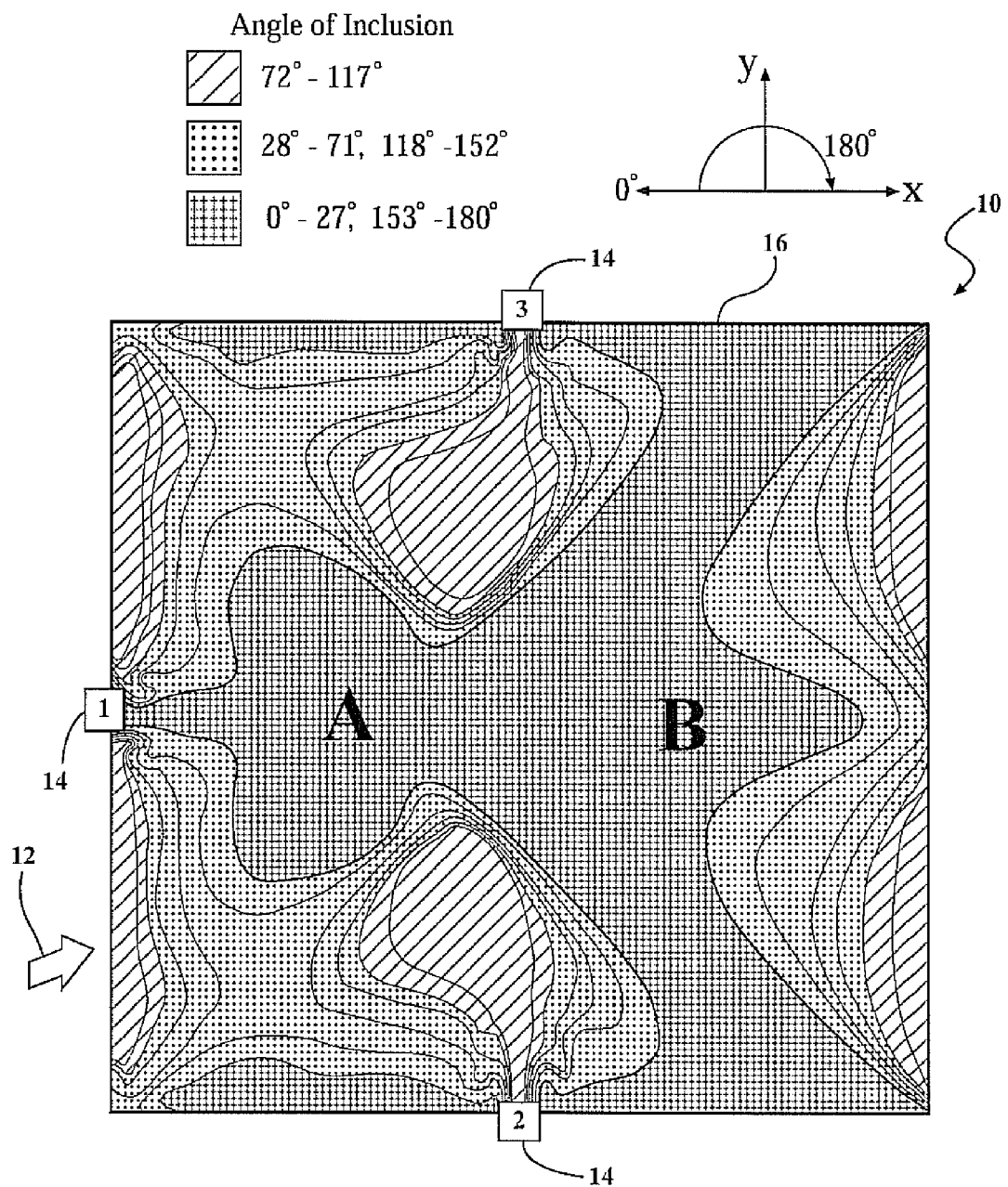
FIG. 3A is a perspective view of a representative thermal flux steering device, or composite material, showing a thermal energy source and a plurality of thermal energy sinks and includes a legend showing different angles of orientation with respect to a shaded region of the material.
Figure 3B:
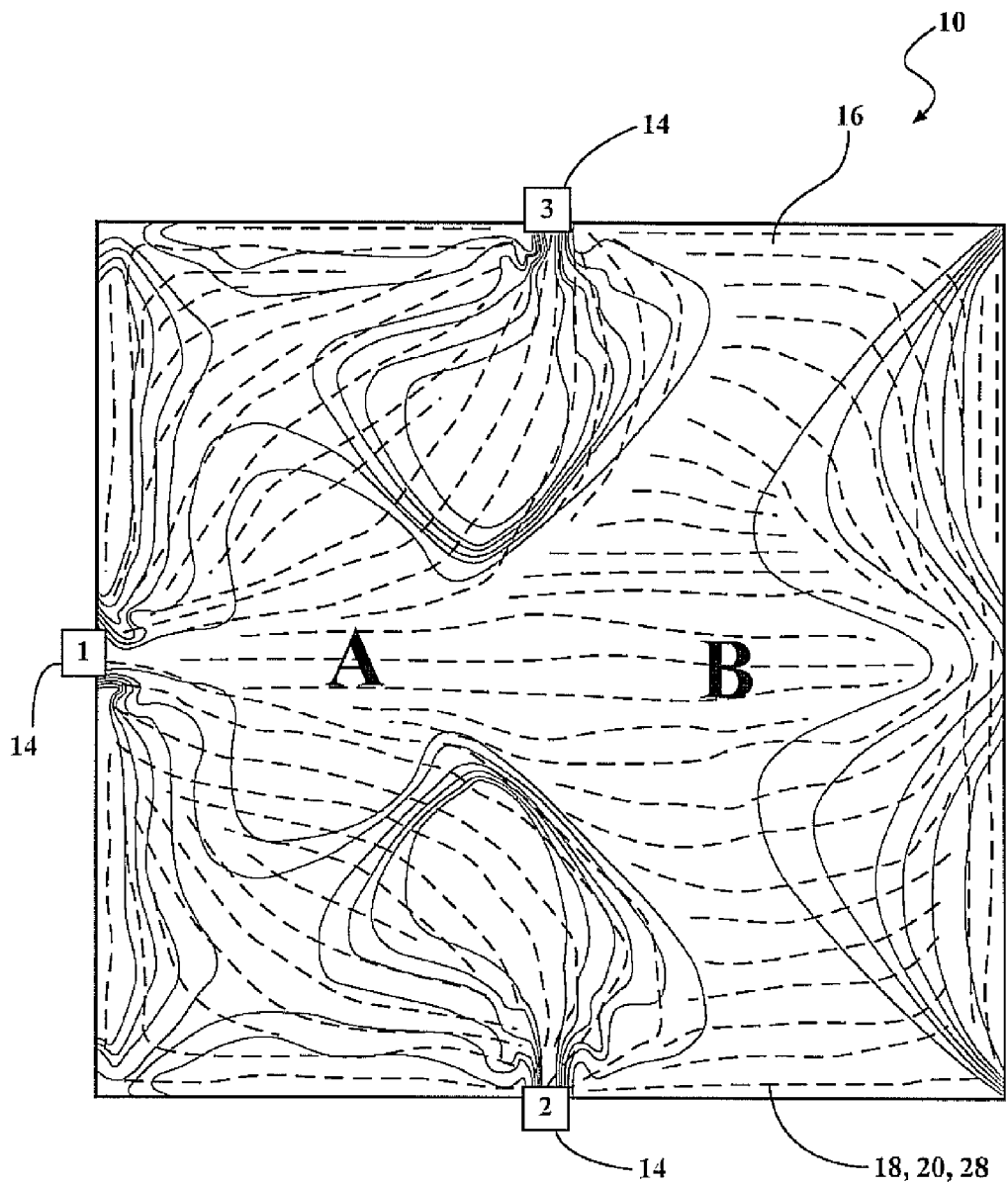
FIG. 3B is a perspective view of FIG. 3A showing the orientation of the thermally conductive inclusions.
Figure 3C:
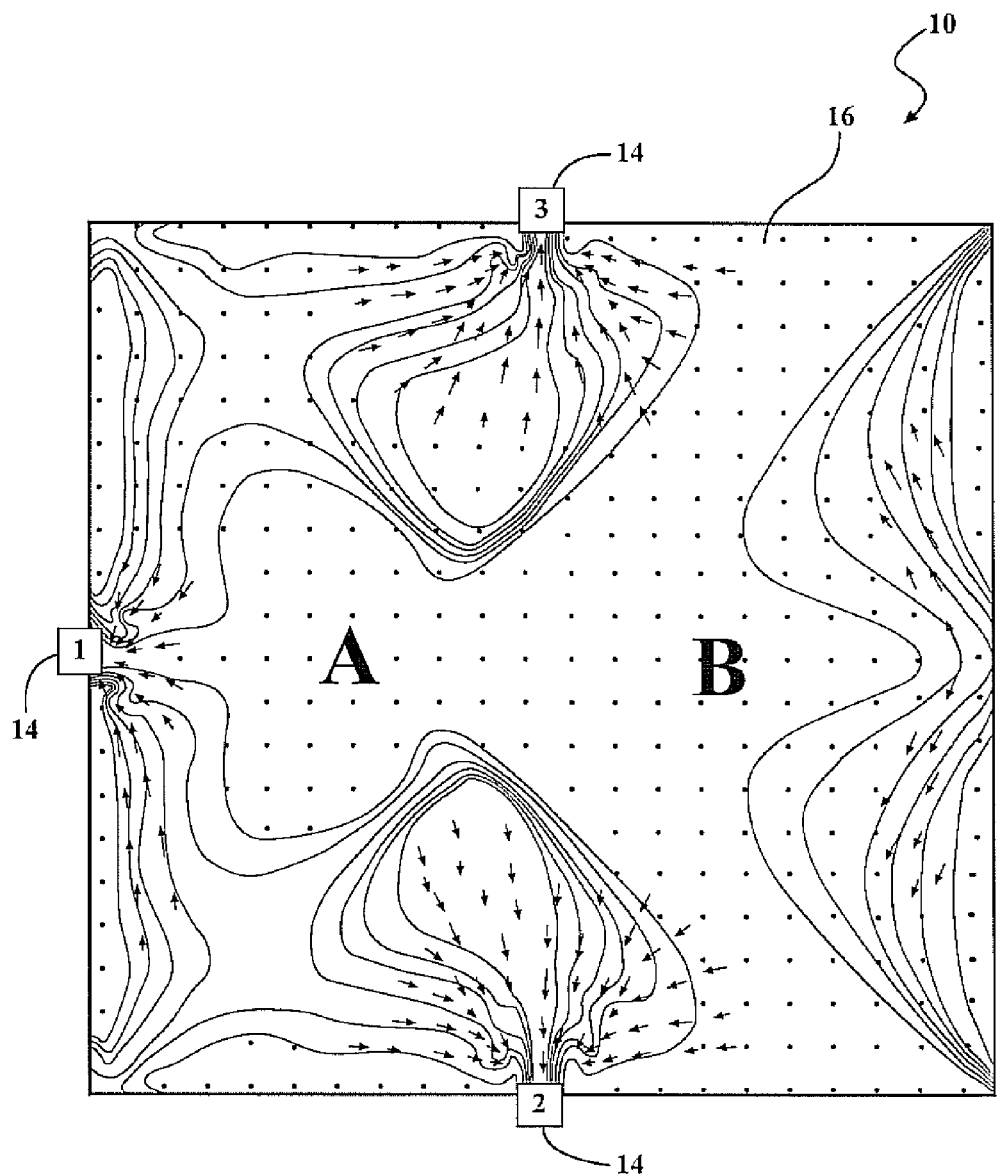
FIG. 3C is a perspective view of FIG. 3A showing the distribution and movement of thermal energy throughout the material.

With reference now to FIGS. 3A-3C, the thermal flux steering device 10 may include a plurality of thermal energy sinks 14 and may have the thermally conductive inclusions 18 oriented so as to distribute thermal energy from the multiple sources. FIG. 3A includes a legend showing different angles of orientation for the thermally conductive inclusions with respect to a shaded region of the matrix 16. FIGS. 3A-3C show a thermal energy source 12 uniformly applied to the bulk of the matrix 16. Left alone, the thermal energy would radiate through the body of an isotropic matrix 16 in a manner indicated in FIG. 4.

The matrix 16 includes a plurality of thermal energy sinks 14 wherein the body of the matrix 16 is operable to steer thermal energy towards each of the thermal energy sinks 14. Thus, with respect to the thermal energy sink 14 labeled number "1," the filler fibers 20 on either side of the sink are oriented generally vertically so as to direct thermal energy to the thermal energy sink 14. The orientation of the thermally conductive inclusions 18 is based generally upon optimizing natural thermal energy flow in the matrix 16. Thus, thermal resistance between regions A and B is generally minimal so that the filler fibers 20 are oriented generally horizontally. As thermal energy moves from region B towards the right edge of the matrix 16, the angle of the thermally conductive inclusions 18 is generally between 45 degrees and 135 degrees so as to redirect thermal energy back towards the thermal energy sinks 14 labeled "2" and "3" disposed on respective top and bottom edges of the matrix 16.

FIG. 3B shows the orientation of the thermally conductive inclusions 18 operable to steer thermal energy towards respective thermal energy sinks 14. FIG. 3C shows the vector of the thermal energy as it moves through the body. For illustrative purposes, the thermally conductive inclusions 18 are asymmetric thermally conductive particles 28. The aysymmetrically shaped particles 28 are oriented so as to steer thermal energy through the body in the path generally shown in FIG. 3C.

Figure 5:
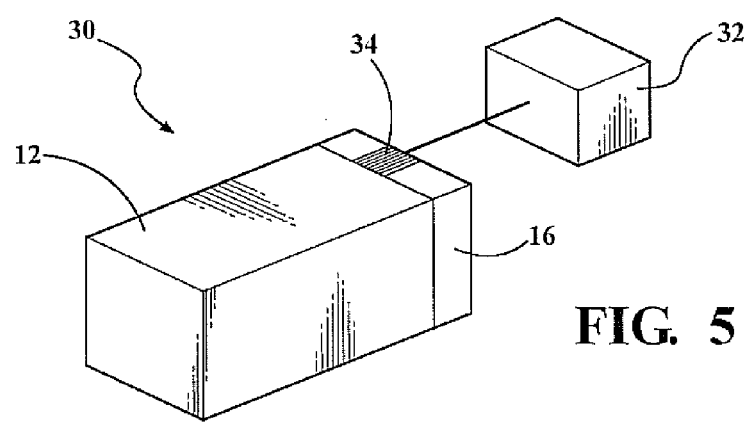
FIG. 5 is a perspective view of a thermal flux harvesting system of the present invention showing the thermal energy source, the thermal flux device, and an ancillary device.

With reference now to FIG. 5, a thermal flux harvesting system 30 of the present invention is provided. The thermal flux harvesting system 30 is operable to harvest thermal flux to actuate an ancillary device 32. The thermal flux harvesting system includes a thermal energy source 12 and a matrix 16 having a thermoelectric device 34 operatively attached to the ancillary device 32. The thermal source 12 may be an electric motor or an internal combustion engine.

The matrix 16 is impregnated with a plurality of thermally conductive inclusions 18. The matrix 16 is operable to hold the thermally conductive inclusions 18 at a fixed angle. The thermally conductive inclusions 18 are distributed throughout the matrix 16 and oriented and angled so as to steer thermal flux from the thermal energy source 12 to the thermal electric device so as to actuate the ancillary device 32. The thermally conductive inclusions 18 may be angled manually using a composite prepreg, or in the case of magnetic particles, using electromagnetic force. For the case of magnetic particles, the electromagnetic force is generally varied so as to set the thermally conductive inclusions 18 at a desired angle.

Figure 6:
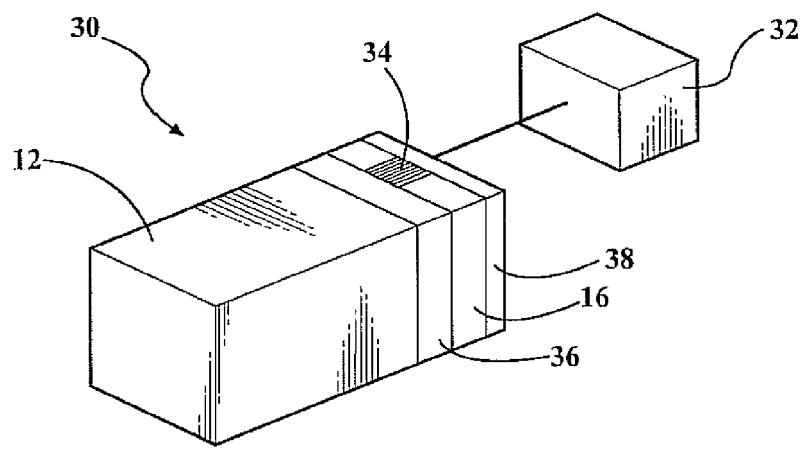
FIG. 6 is a perspective view of a second preferred embodiment of the present invention showing a composite material disposed between a thermally conductive layer and a thermally insulating layer.

With reference now to FIG. 6, the thermal flux harvesting system may further include a thermally conductive layer 36 and a thermally insulating layer 38. The thermally conductive layer 36 is exposed to the thermal energy source 12 and the thermally insulating layer 38 is opposite the thermally conductive layer 36. The matrix 16 is disposed between the thermally conductive layer 36 and the thermally insulating layer 38. The thermally conductive layer 36 is operable to absorb thermal energy and direct thermal energy into the matrix 16. The thermally insulating layer 38 is operable to contain thermal energy within the system so as to prevent thermal energy from being wasted and optimize the thermal energy for storage and use with the ancillary device 32. The thermally conductive layer 36 and the thermally insulating layer 38 may be formed from material having predetermined load bearing capabilities. Such materials are currently known and used in the art and illustratively include molded polymers or ceramics.

During operation the thermally conductive layer 36 is subject to thermal energy from the thermal energy source 12. Through conduction the thermal energy is passed on to the matrix 16. The thermally conductive inclusions 18 steer the thermal flux to the thermal energy sink 14 shown herein as a thermoelectric device 34. The thermoelectric device 34 retains the thermal energy and is operable to transform the thermal energy into electricity so as to actuate the ancillary device 32.

Figure 8:
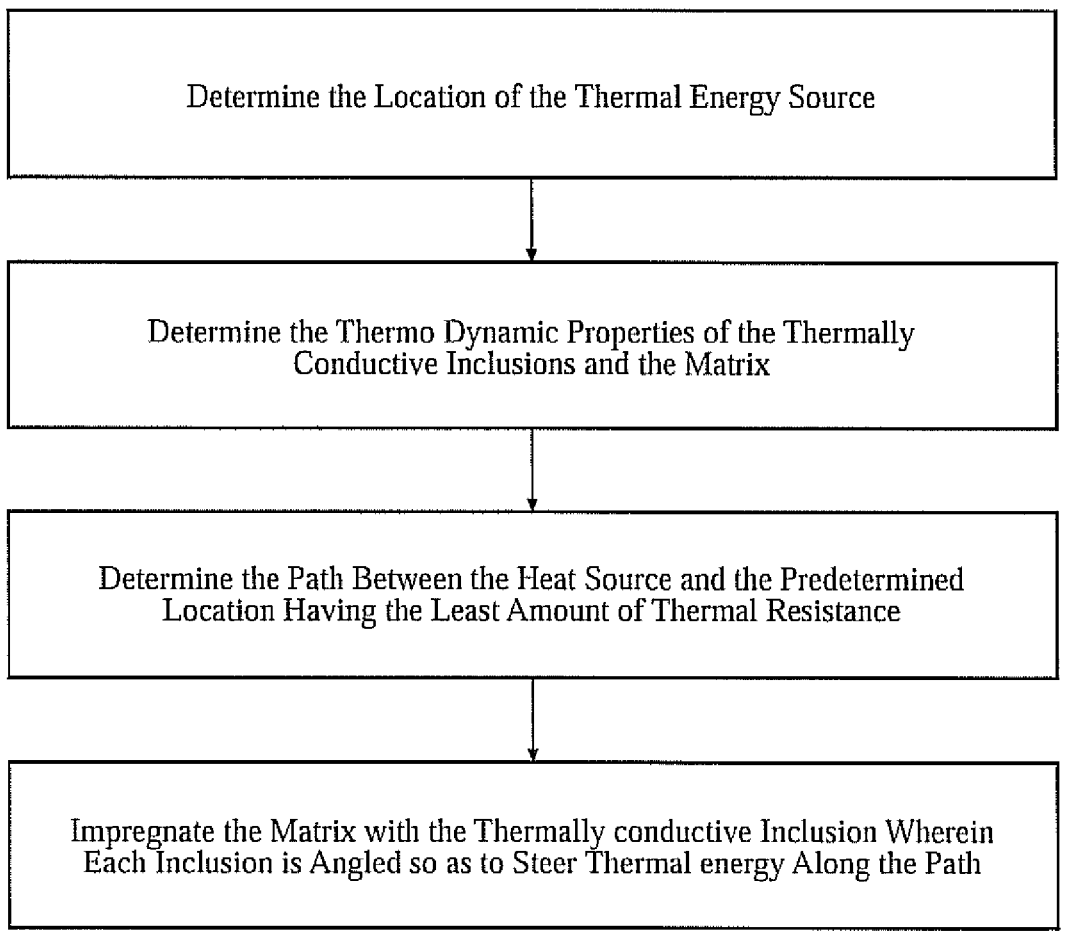
FIG. 8 is a diagram showing the method for harvesting thermal energy in a composite material subjected to a thermal source.

With reference now to FIG. 8, a method 40 for harvesting thermal energy in a matrix 16 subjected to a thermal source is provided. The method 40 includes a step of providing a plurality of thermally conductive inclusions 18, and determining the thermodynamic properties of the thermally conductive inclusions 18 and the matrix 16. The matrix 16 is operable to hold a plurality of thermally conductive inclusions 18 in a fixed position. The method 40 further includes the step of determining the orientation of thermally conductive inclusions 18 within the matrix 16 so as to steer thermal energy to a predetermined location while minimizing thermal resistance and heat dissipation.

Figure 7:
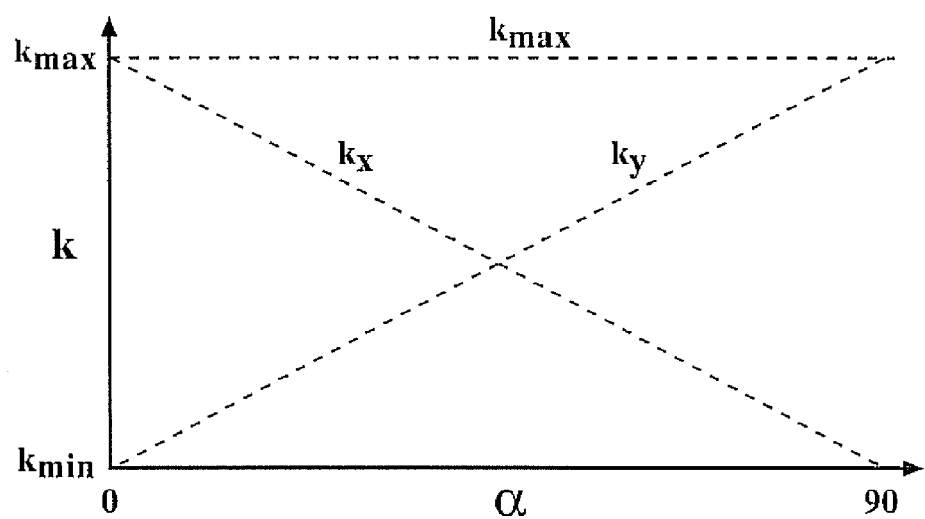
FIG. 7 is a chart showing the linear interpolation of thermal conductivity in the X and Y directions with respect to the angle orientation of the thermally conductive inclusions.

With reference now to FIG. 7, a chart showing the orientation angle of the thermally conductive inclusion 18 with respect to the approximate thermal conductivity in the X and Y directions is provided. The thermally conductive inclusions 18 are oriented and distributed within the matrix 16 so as to minimize thermal resistance between the thermal energy source 12 and the predetermined location for which thermal energy is to be gathered and harnessed.

The method 40 begins with determining the location of the thermal energy source 12 and the location of the thermal energy sink 14. The method 40 continues to the step of determining the thermodynamic properties of the thermally conductive inclusions 18 and the matrix 16 so as to calculate a path between the heat source and a predetermined location having the least amount of thermal resistance. As shown below, the minimization of thermal resistance along the matrix 16 may be achieved by minimizing the value of the equation $f=K_{max}*(1-\alpha)*(dT/dx)^2+K_{max}*(\alpha)*(dT/dy)^2$ with respect to the inclusion orientation angle, $\alpha$. From this optimization procedure the orientation angle of the respective thermally conductive inclusions 18 may be derived. The matrix 16 may then be impregnated with the thermally conductive inclusions 18 to form a composite material wherein each inclusion is angled so as to steer thermal energy from the thermal energy source 12 to the thermal energy sink 14. More specifically, the matrix 16 is impregnated with the thermally conductive inclusions 18 such that the thermally conductive inclusions 18 are angled so as to steer thermal energy along the path.

Obviously, many modifications and variations of the present invention are possible in light of the above teachings and may be practiced otherwise than as specifically described while within the scope of the appended claims.

I claim:

1. A thermal flux steering device for guiding thermal flux, the thermal flux is generated from a thermal energy source, the thermal flux steering device comprising:
   a matrix impregnated with a plurality of thermally conductive inclusions, each of the plurality of thermally conductive inclusions is an asymmetric shaped particle enclosing a volume between the microscale and nanoscale;
   a heat sink thermally coupled to the matrix, wherein the heat sink is displaced from a surface opposite of the thermal energy source, the plurality of thermally conductive inclusions angled and aligned with respect to one another so as to steer thermal flux to the heat sink.

2. The thermal flux steering device as set forth in claim 1, wherein the thermally conductive inclusion is one of either a filler fiber or a thermal conductive particle.

3. The thermal flux steering device as set forth in claim 2, wherein the filler fiber is one of either a chopped carbon fiber or a metal particle.

4. The thermal flux steering device as set forth in claim 2, wherein the filler fibers are elongated.

5. The thermal flux steering device as set forth in claim 1, wherein the thermally conductive inclusion is triangular or ellipsoidal shaped.

6. The thermal flux steering device as set forth in claim 1, further including a thermally conductive layer disposed on the matrix.

7. The thermal flux steering device as set forth in claim 6, further including a thermally insulating layer, the matrix disposed between the thermally insulating layer and the thermally conductive layer.

8. The thermal flux steering device as set forth in claim 1, wherein the thermal energy sink is a thermoelectric device operable to transform thermal flux into electricity.

9. The thermal flux steering device as set forth in claim 1, wherein the matrix is formed from cyanate-ester resin.

10. The thermal flux steering device as set forth in claim 1, wherein the matrix is formed from ceramic.

11. The thermal flux steering device as set forth in claim 1, wherein the matrix is formed from a polymer.

12. The thermal flux steering device as set forth in claim 1, wherein each of the plurality of inclusions is angled and aligned with respect to one another between zero and one hundred and eighty degrees.

13. The thermal flux steering device as set forth in claim 1, wherein the matrix includes a generally planar surface, and wherein the plurality of thermally conductive inclusions lie along a plane generally parallel to the planar surface of the matrix.

14. The thermal flux steering device as set forth in claim as set forth in claim 1, wherein the matrix is formed of a plurality of planar surfaces layered so as to form a three dimensional structure.

15. The thermal flux steering device as set forth in claim 1, wherein the plurality of thermally conductive inclusions are angled so as to steer thermal flux towards a discrete location of the matrix, wherein thermal flux within the matrix is concentrated in the discrete location.

16. The thermal flux steering device as set forth in claim 1, wherein a thermal energy sink is at least two thermal energy sinks, each of the thermal energy sinks spaced apart from each other and wherein one of the at least two thermal energy sinks is disposed on a different plane.

17. The thermal flux steering device as set forth in claim 16, wherein each of the at least two thermal energy sinks are spaced apart at different distances from the thermal energy source.

18. A thermal flux harvesting system operable to harvest thermal flux to actuate an ancillary device, the thermal flux harvesting system comprising:

a thermal energy source; and a matrix having a thermoelectric device operatively attached to the ancillary device, the thermoelectric device displaced from a surface opposite the thermal energy source, the matrix impregnated with a plurality of thermally conductive inclusions, each of the plurality of thermally conductive inclusions is an asymmetric shaped particle enclosing a volume between the microscale and nanoscale, the plurality of thermally conductive inclusions angled so as to steer thermal flux from the thermal energy source to the thermoelectric device and actuate the ancillary device, and wherein a portion of the plurality of thermally conductive inclusions are angled so as to steer thermal flux to the thermoelectric device.

19. The thermal flux harvesting system as set forth in claim 18, wherein the thermally conductive inclusion is a filler fiber.

20. The thermal flux harvesting system as set forth in claim 19, wherein the filler fiber is one of either a chopped carbon fiber or a metal particle.

21. The thermal flux harvesting system as set forth in claim 18, further including a thermally conductive layer disposed on the matrix.

22. The thermal flux harvesting system as set forth in claim 18, further including a thermally insulating layer, the matrix disposed between the thermally insulating layer and the thermally conductive layer.

23. A method for harvesting thermal energy in a matrix subjected to a thermal source, the method comprising the steps of:

determining the location of the thermal energy source;

providing a plurality of thermally conductive inclusions;

determining the thermodynamic properties of the thermally conductive inclusions and the matrix;

providing a heat sink, the heat sink thermally coupled to the matrix, wherein the heat sink is displaced from a surface opposite the thermal energy source;

calculating a predetermined path between the heat source and the heat sink having the least amount of thermal resistance; and impregnating the matrix with the thermally conductive inclusions wherein each thermally conductive inclusion is angled so as to steer thermal energy along the predetermined path.

* * * * *